United States Patent [19]

Bachman

[11] 4,011,144

[45] Mar. 8, 1977

[54] METHODS OF FORMING METALLIZATION PATTERNS ON BEAM LEAD SEMICONDUCTOR DEVICES

[75] Inventor: Albert K. Bachman, Allentown, Pa.

[73] Assignee: Western Electric Company, New York, N.Y.

[22] Filed: Dec. 22, 1975

[21] Appl. No.: 643,201

[52] U.S. Cl. .................................. 204/15; 29/591; 204/40

[51] Int. Cl.² ...................... C25D 5/02; C25D 7/12

[58] Field of Search ............... 204/15, 40; 427/89, 427/92; 29/580, 591

[56] References Cited

UNITED STATES PATENTS

| | | | |
|---|---|---|---|
| 2,823,175 | 2/1958 | Roschen | 204/15 |
| 3,287,612 | 11/1966 | Lepselter | 317/235 |
| 3,343,256 | 9/1967 | Smith et al. | 29/578 |
| 3,388,048 | 6/1968 | Szabo, Jr. | 204/15 |
| 3,426,252 | 2/1969 | Lepselter | 317/234 |
| 3,536,594 | 10/1970 | Pritchard | 204/27 |
| 3,625,837 | 12/1971 | Nelson et al. | 204/15 |
| 3,701,705 | 10/1972 | Hetrich | 156/345 |
| 3,745,094 | 7/1973 | Greene | 204/15 |
| 3,759,767 | 9/1973 | Walls | 156/17 |
| 3,841,930 | 10/1974 | Hetrich | 156/16 |

OTHER PUBLICATIONS

The Western Electric Engineer, vol. XI, No. 4, Dec. 1967, pp. 3–15.

*Primary Examiner*—T. M. Tufariello
*Attorney, Agent, or Firm*—W. O. Schellin

[57] ABSTRACT

Methods of forming conductive paths including beam leads on a surface of a semiconductor wafer includes the deposition of conductive films of materials such as titanium and platinum on the surface as a base for a subsequent deposition of a metal, such as gold. By selectively etching the titanium and platinum films, patterns of the desired conductors are generated. An intermediate masking step shields the surface of the wafer while the beam leads are plated prior to gold plating the remaining conductors of the pattern.

9 Claims, 12 Drawing Figures

METHODS OF FORMING METALLIZATION PATTERNS ON BEAM LEAD SEMICONDUCTOR DEVICES

BACKGROUND OF THE INVENTION

1. Field of the Invention

This invention relates to electronic devices having metallization patterns formed on at least one surface thereof, and to methods of forming such patterns. to give a particular example, the invention relates to a beam-leaded semiconductor chip which has a metallization pattern including elements of two different thicknesses. Such a chip has, for instance, a gold plated pattern of conductors on the surface of the chip itself. From this pattern, beam leads extend beyond the body of the chip. The beam leads are also usually formed of gold, however, they are substantially thicker than the conductors on the chip.

2. Description of the Prior Art

One of the techniques employed in the semiconductor industry for joining semiconductive chips to substrates is thermocompression bonding of beam leads extending laterally from such chips. The chips are manufactured from a semiconductor slice or wafer which is ultimately separated into individual chips. After the chips have been separated from the wafer, they are usually mounted to substrates. The substrates have conductive patterns to which the beam leads of the chips are bonded. External leads are also bonded to such patterns to connect the resulting chip assemblies into larger circuits. The beam leads are therefore used to physically mount the chips and to electrically connect the chips to the more rugged external leads.

U.S. Pat. No. 3,426,252 to M. P. Lepselter discloses a beam lead structure and methods of forming beam lead metallization patterns. In summary of the Lepselter technique, platinum silicide is first formed at each opening in an insulating surface of a semiconductor device bonded in a wafer. A layer of titanium and then a layer of platinum are deposited on the wafer. A gold pattern including the beam leads is formed on the surface of the platinum layer with the aid of conventional photoresist masking. Openings are formed in the photoresist mask. Through these openings gold is selectively plated to form an interconnecting pattern and the beam leads, all to the same thickness. After removing the photoresist mask, the platinum and titanium layers which are not protected by the gold pattern are then removed by conventional back sputtering techniques.

U.S. Pat. No. 3,388,048 to J. M. Szabo discloses another manufacturing method involving beam leads. According to the Szabo disclosure, the beam leads and interconnecting conductors on the surface of the chip are plated to two different thicknesses. In preparation for a selective plating step which does not involve masking, the platinum film and then the titanium film are selectively etched to completely remove the material of each film from the surface of the wafer with the exception of the area of a base on which the gold interconnecting conductors and beam leads are disposited. The portions of the base on which the beam leads are to be formed are electrically separated from the remainder of the base by respective gaps. The beam-lead portions of the base are then electrically connected through the wafer to form cathode electrodes in a plating circuit. Initially, only the connected beam-lead portions of the base are gold plated. However, once the deposited gold on the beam lead portions bridges the gaps and contacts the interconnecting portions of the base, these portions are also plated. The beam lead portions continue to be plated to achieve a desired greater thickness than the interconnecting portions. A difficulty with this prior art process is to accurately control the time at which the various gaps in base become electrically bridged. Any variation in gap widths, for instance, would naturally result in a deviation from a desirable difference in the thickness between the interconnecting conductors and the beam leads.

A particular metallization technique which has been adopted by the industry is described in an article in the December, 1967, issue of *The Western Electric Engineer*. The article, beginning on page 2 of the referred-to issue, entitled "Manufacturing Beam-Lead Sealed-Junction Monolithic Integrated Circuits" by S. S. Hause and R. A. Whitner, discloses a combination of photoresist masking steps and of gold plating steps according to which the beam leads are formed independently of the remaining pattern of the wafer. While the method described in the above article reflects the current art of forming conductive interconnecting paths and beam leads on wafers, some problems are connected therewith. The problems appear to stem from faulty photoresist masking. Such faults in masking may, for instance, occur because of the presence of dust particles on the surface of the wafer during processing of the photoresist. The problems are evidenced by occasional plating defects, such as gold nodules and cross-connections between adjacent conductors. While only a small percentage of the chips in process are affected by such plating defects, it is nevertheless desirable to minimize, or eliminate entirely, these defects.

SUMMARY OF THE INVENTION

An object of the invention is, therefore, to improve present methods of forming conductive paths on the surface of a semiconductor wafer.

A further object of the invention is to provide methods of plating beam leads to a first thickness and of plating other conductive paths to a second, lesser thickness than the first thickness without having to rely on the mechanism of controlled bridging of a gap in a plating cathode.

In accordance with the above objects, one aspect of the present invention includes a method for forming first and second conductors of a first and a second thickness, respectively, on a surface of a semiconductor wafer. The method includes forming a patterned base layer on the surface of the wafer. The pattern of the base layer coincides with the intended loci of conductors to be formed. The surface is then masked and openings are formed in the mask, the position of the openings coinciding with predetermined portions of the base layer on which the first conductors are to be formed. The first conductors are formed to a predetermined thickness after which the mask is removed from the surface of the wafer. The second conductors are formed on the remaining portions of the base layer by electrically connecting the base layer through the wafer into a plating circuit. A top layer is deposited on the first conductors to further increase the predetermined thickness of said conductors to the first thickness while the second conductors are plated to the second thickness.

BRIEF DESCRIPTION OF THE DRAWING

The following detailed description will be best understood when read in conjunction with the accompanying drawing wherein.

DETAILED DESCRIPTION

Figure 1:
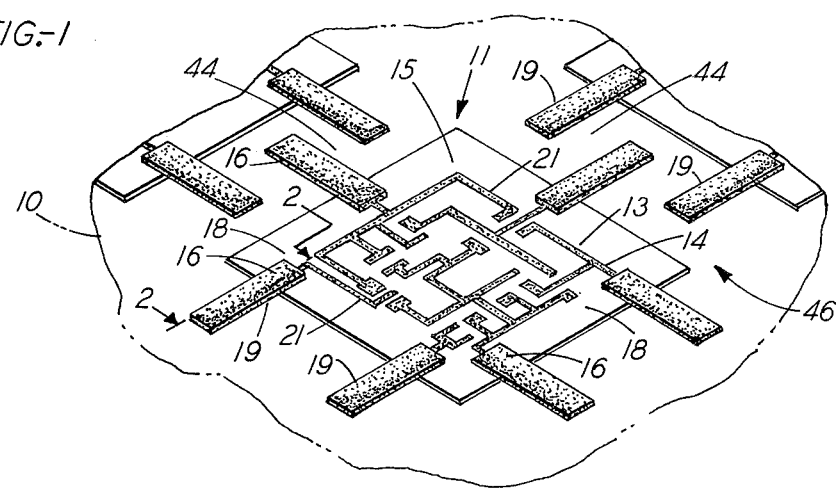
FIG. 1 is an isometric representation of a typical beam lead chip after separation from other chips in a semiconductor wafer, a metallization pattern of the chip having been formed on the wafer in accordance with the present invention.

Referring now to FIG. 1, there is shown a portion of a semiconductor wafer 10 after final processing including a separation etch operation. The separation etch operation divides the wafer 10 into a plurality of discrete semiconductor chips 11. Each of these chips 11, after being separated from the wafer 10, includes a semiconductor body 13 and a pattern 14 of conductors formed on a major surface 15 of the body 13. Prior to the steps which will be described hereinafter, the semiconductor body 13 of the wafer 10 has been subjected to conventional wafer processing steps. These processing steps include deposition of impurities and their diffusion. Typically, the impurities are selectively diffused into the body 13 to generate regions of negative and positive conductivity type. The regions and their junctions become various active or passive semiconductor device elements, such as transistors or resistors. After the various diffusion steps the surface 15 is sealed with one or more protective layers. Over the surface of the protective layers, the conductor pattern 14 interconnects these device elements and then provides supports to mount the chip 11 to a rigid substrate (not shown). The chip 11 depicted in FIG. 1 is shown with the surface 15 facing upward for illustrative purposes. Typically the separation etch operation is carried out with the surface 15 and the conductors facing and the wafer mounted to a support. The support protects the pattern 14 from damage. The mounted chips 11, once separated are also retained on the support in a known array to facilitate later automated handling.

In serving the functions of interconnecting and of supporting the chip 11, the conductor pattern 14 preferably has two types of conductor elements, each type of conductor element having a thickness different from that of the other type of conductor element. Conductor elements of a first type, namely, supporting elements or beam leads 16 are anchored to peripheral areas 18 of the body 13. Unsupported ends or beams 19 of the beam leads 16 extend from the body 13. Ultimately the beams 19 become bonded to the substrate (not shown). Because the bonded beams 19 hold the chip 11 in place on the substrate, the beam leads 16 are preferably of a greater thickness and strength than the second type elements, namely, interconnects 21.

The interconnects 21, in contrast to the beam leads 16, are fully supported by the surface 15 of the body 13. Consequently, it is not required for the interconnects 21 to have a material strength as great as that of the beam leads 16. As a typical example, the thickness of the interconnects 21 is in the order of 20,000 angstroms, whereas the thickness of the beam leads 16 is preferred to be in the order of 120,000 angstroms. The typical thickness of the interconnects 21 is adequate for the function of transmitting electrical signals between the various elements in the semiconductor body 13. An increase in the thickness of the interconnects 21 beyond what is required to serve that function is wasteful of gold and increases the chances of inadvertent cross-connecting two otherwise separate interconnects 21.

Figure 2A:
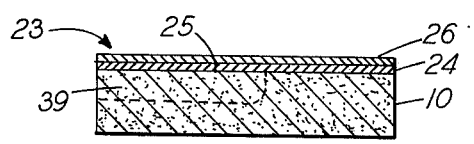
FIGS. 2a–2i show a cross section of a portion of the semiconductor wafer including a portion of the chip of FIG. 1 during different stages of a metallization process of the present invention.
Figure 2F:
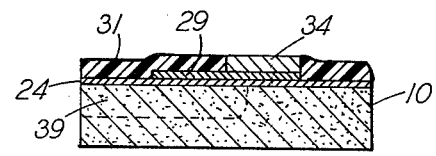

In FIGS. 2a to 2j, there is shown a cross section of a portion of the wafer 10 in progressive stages of a metallization process to form the beam leads 16 and the interconnects 21. FIG. 2a shows the wafer 10 completely covered with a base layer 23. The base layer includes a first or titanium layer 24 adjacent a surface 25 of the wafer 10. The titanium 24 is covered with a second or platinum layer 26. The term "surface of the wafer" includes the major surface 15 of each chip as shown in FIG. 1 in addition to surface portions of the wafer which initially support the beam leads 16 and which are then etched away during the separation etch. The term "surface of the wafer" further includes various passivation layers and other possible topographical features of various semiconductor device elements which may have been generated during various process steps prior to the metallization process.

Figure 2B:
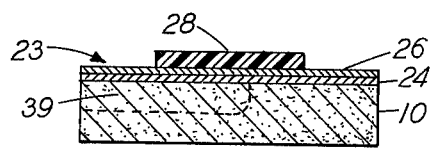

In FIG. 2b, a portion of the base layer 23 has been selectively covered with a mask 28 of photoresist material. The mask 28 is formed by conventional methods which include covering uniformly the surface of the wafer 10 with a layer of photoresist, and then selectively exposing the layer in accordance with a desired pattern. Portions of the photoresist are then removed in a solvent bath while the remaining photoresist forms the mask 28 to shield predetermined portions of the surface of the wafer 10 from electrolytic action in a subsequent etching step.

Figure 2G:
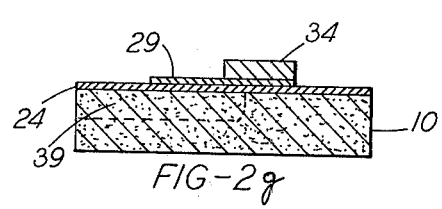
Figure 2C:
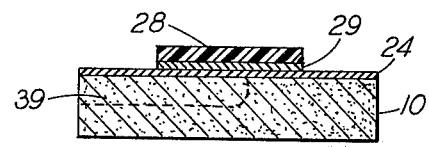
Figure 2H:
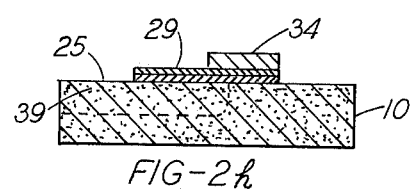

FIG. 2c shows the wafer 31 after such an etching step in aqua regia wherein the platinum layer 26 not covered by the photoresist 38 has been selectively removed. The etching step in aqua regia therefore defines a predetermined platinum pattern 29 on the titanium film 24. After the platinum has been selectively etched and the wafer 10 is rinsed, the remaining photoresist is removed.

Figure 2D:
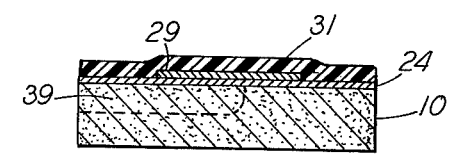

In a further step shown in FIG. 2d, the entire surface of the wafer 10 is covered by a photoresist layer 31. In preparation of a first gold plating operation an aperture or window 32 is formed in the photoresist layer 31 in each area where one of the beam leads 16 are to be formed on the surface of the wafer 10. FIG. 2c shows a representative window 32 formed over an end portion 33 of the platinum pattern 29.

In the first gold plating operation, a first layer 34 of gold for each of the beam leads 16 is electroplated on each such end portion 33 of the pattern 29 which has been exposed by respective windows 32. Thereafter, the remaining photoresist masking layer 31 is removed from the surface of the wafer as shown in FIG. 2g. Using the platinum pattern 29 and the plated gold layer 34 as a mask, exposed portions of the titanium film 24 are now removed in a conventional etching operation. A commonly used solution of ethylene diamene tetracetic acid (commonly referred to as EDTA) and hydrogen peroxide is applied to the wafer 10 for a sufficiently long time to remove the film 24. The etching time interval depends on several parameters, such as the concentration of the etchant, the etching temperature and, of course, the thickness of the film to be removed. This etching operation exposes the surface 25 of the wafer 10 in areas not covered by the existing platinum pattern 29.

Figure 2I:
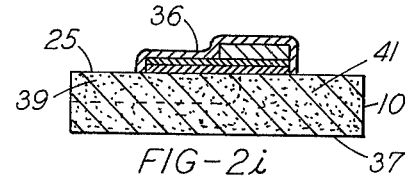
Figure 2E:
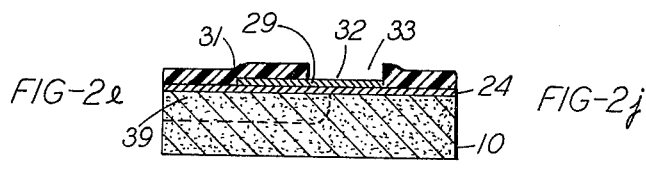

Referring to FIG. 2i, the platinum pattern 29 including the layer 34 of the beam leads 16 is now gold plated in a second thin gold plating operation. The term "thin" refers to the thickness of a second gold deposition layer 36 in comparison to the previously deposited layer 34. The first layer 34 formed substantially the total thickness of gold for the beam leads 16 on the end portions 33 of the pattern 26.

During the second gold plating operation, contact to the pattern is made from the back 37 of the wafer 10 to conductive portions, in particular, to the beam leads 16 on the front side 38 of the wafer 10. The back 37 of the wafer 10 which establishes the continuity with the plating circuit becomes shielded from contact with the plating bath to prevent plating on the back 37. Since contact is made through the wafer to the beam leads 16 of the pattern 26, all pattern elements have to be coupled through a conductive path, which may be a resistor, to at least one of the beam leads on the wafer 10 to become part of the plating circuit. This requirements becomes apparent when it is considered that each beam 19 extends from a device domain 39 shown in FIG. 2i, to semiconductor material 41 of the wafer 10 which has not been dedicated as a device. The device domain 39, however, is generally electrically isolated from the back 37 of the wafer 10.

For this second gold plating operation no further masking is needed. The plated gold deposition film or layer 36 forms exclusively on all of the connected pattern elements including the previously plated layer 34 of the beam leads 16. The additional gold layer 36 adds to the thickness of the beam leads 16 so that the thickness of the beam leads 16 is further increased to a final desired value.

Figure 2J:
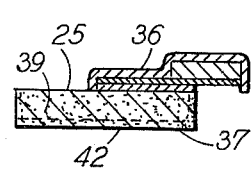
FIG. 2j shows the respective portion of the chip after the chip has been separated from the wafer.

FIG. 2j shows the device 42 as the chip 11 separated from the wafer 10 by steps following the described metallization process. In FIG. 2j, the back 37 of the wafer is shown as having been thinned, as, for instance, by either chemical or mechanical lapping, in accordance with existing wafer preparation techniques. Thereafter the wafer is subjected to the separation etch process. During this process, device domains 39 are protected by proper photoresist masking applied to the back 37. Thereafter, the semiconductor material 41 is etched away between each of the device domains 39 so that only the beams 19 remain between the individual domains 39. The remaining domains 39 together with the pattern 14 now form the chips 11 as shown in FIG. 1. Each chip 11 is physically separated from the other chips 11 of the wafer 10 by an etched channel 44. The beams 19 of the beam leads 16 extend from the chips 11 into the channel 44 where they form an interdigitated array 46 with the beams 19 from adjacent chips 11.

Various modifications of the described method are possible within the spirit and scope of the present invention. One of such modifications relates to a variation in the sequence of the steps in the metallization process. For instance, the titanium layer 24 may be selectively etched either early or toward the end of the metallization process. The Flow diagram of FIG. 3 show a preferred and an alternate sequence of the process.

Figure 3:
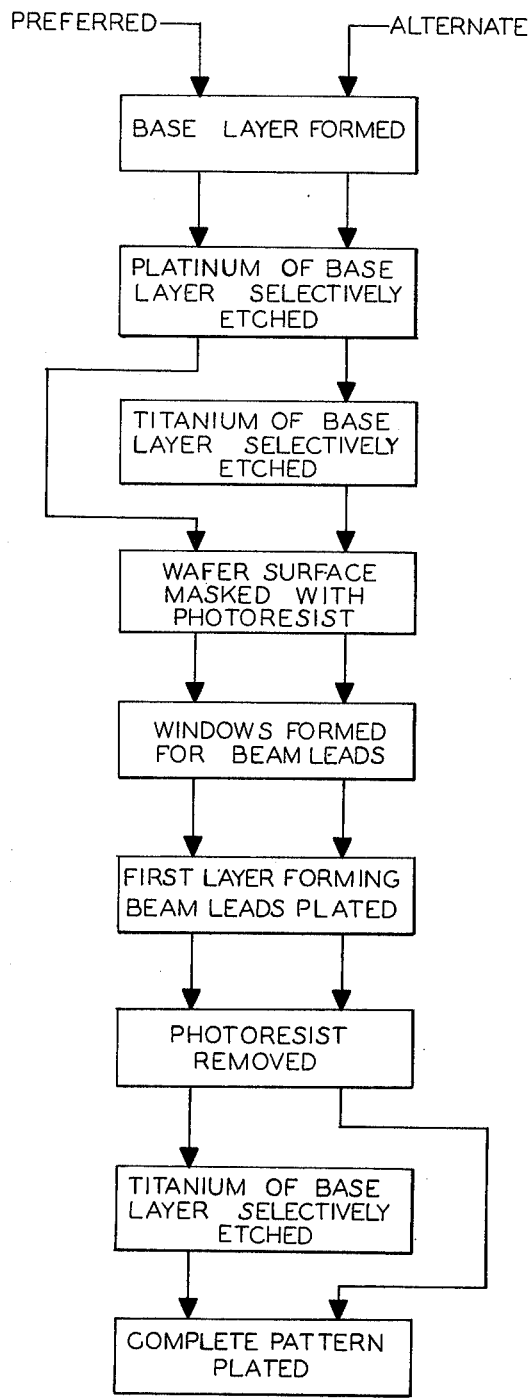
FIG. 3 shows a flow chart of a preferred and an alternate process for forming the metallization pattern on a wafer in accordance with the present invention.

In referring to FIG. 3, forming the base layer 24 on the surface 15 is common to either the preferred or the alternate method. Both the titanium layer 24 and the platinum layer 26 are typically deposited on the surface 25 by conventional sputter methods.

As shown in FIG. 3, the platinum layer 26 is then selectively etched. Prior to the etching operation a photoresist layer is applied and selectively removed. The remaining photoresist features protect portions of the base layer 23 which correspond to the intended metallization pattern 14. Thus, when the exposed platinum portions of the base layer 23 are selectively etched in aqua regia the unprotected platinum is dissolved, and the portions of the platinum shielded by the photoresist form the positive platinum image of the desired pattern 14 on the titanium still covering the surface 25 of the wafer 10.

Forming the base layer 23 and selectively etching the platinum is preferably done in accordance with prior art practices. However, subsequent to the steps for preparing the base layer 23 to outline or define the metallization pattern 14 as a positive image of platinum remaining on the titanium layer 24, the present process significantly departs from the manner in which the pattern 14 has been formed in the past. After the image of the desired pattern 14 remains in the form of platinum on the yet continuous layer 24 of titanium preferably the entire wafer 10 is again coated with the layer 31 of photoresist. By selectively exposing the photoresist, the windows 33 are generated in the photoresist layer 31. The beam leads 16 are then formed preferably by electrodepositing gold in the openings formed by the windows 33. The electrodeposition or plating operation affects only the exposed portions of the image of the pattern 14 since all remaining areas of the surface 25 of the wafers remain protected by the layer 31 of photoresist. The platinum areas under the windows 33 can be connected into the plating circuit (not shown) either by contacting with a cathode electrode a portion of the titanium layer 24 from the otherwise masked side or an edge of the wafer 10, or by contacting the titanium from the back 37 through the conductive portions of the wafer 10.

Again referring to FIG. 3, in the alternate sequence, the titanium layer 24 is selectively removed from the surface 25 of the wafer 10 before the surface 25 of the wafer 10 is masked with a layer 31 of photoresist as has been described for the preferred sequence of steps. Removing all conductive material from the surface of the wafer 10 except for that which forms the desired image of the pattern 14 diminishes the possibility of inadvertent accumulation of plated metal between the interconnects 21. Any discernible accumulation of metal on any portion of the wafer 10 ultimately renders unacceptable the chip 11 which is formed out of the respective portion of the wafer 10. The windows 32 are generated in the photoresist layer 31 and the beam leads 16 are formed as described with respect to the preferred sequence of steps.

After the gold has been electrodeposited for the beam leads 16 by either of the described sequence of steps, the photoresist layer 31 is completely removed from the surface 25 of the wafer 10. According to the preferred embodiment, portions of the titanium layer 24 which are not covered by the layer 26 of platinum are now etched, using the platinum pattern and deposited gold as a mask to protect the underlying portions of the titanium layer 24. According to the alternate sequence of steps the titanium layer 24 has already been removed in areas not shielded by the platinum image of the pattern 14 prior to the application of the photoresist layer 31 and prior to plating the beam leads 16.

During the next operation, gold is uniformly plated over the entire pattern 14. This second or final gold plating step is carried out without masking of areas adjacent the desired pattern 14. However, the back 37 of the wafer 10 is protected from the plating action. One way of sealing the back 37 of the wafer 10 from the plating bath is using a miniscus-type plating apparatus which permits the wafers to be positioned slightly above the surface of the plating bath. The plating fluid then tends to wet the entire facing surface 25 of the wafer and tends to form a miniscus around the periphery of the wafer 10. The back 37 of the wafer 10 facing away from the bath remains untouched by the plating fluid. As an alternative a sealing wafer holder may be employed. Such a wafer holder applies a peripheral seal to one surface of the wafer 10 thus shielding the respective surface from the plating bath. A typical holder of this type is described in U.S. Pat. No. 3,536,594 issued 10-27-70 to E. J. Pritchard. In addition to shielding one side of the wafer while the wafer is immersed in the plating bath, the holder also provides cathodic contact to the shielded back 37.

The structure of the gold plated pattern 14 formed in accordance with the present invention differs from the structure of patterns formed in accordance with the prior art. As shown in FIG. 2j, the thickness of the beam leads 16 of the chip 11 is established primarily through the layer 34. The second gold deposition layer 36 covers both the layer 34 and the remaining portions of the pattern 14. The second layer consequently forms a continuous and homogenious path between the chip 11 and a respective bond site on the substrate. It is believed that the second layer 36 fills in abrupt discontinuities in the gold of the layer 34, since the resulting beam leads 16 have been observed as possessing somewhat greater strength than similar beam leads formed in accordance with prior art processes.

Another advantage of the structure of the pattern 14 formed in accordance with the present invention is the increased uniformity of the plated gold with less incidence of unacceptable defects.

While a specific embodiment of the invention with an alternative to a particular aspect of the invention has been described in detail it should be realized that other modifications and changes are possible without departing from the spirit and scope of the invention.

What is claimed is:

1. A method of forming conducting paths including supporting elements on a surface of a semiconductor wafer, which comprises:
    depositing a conductive film on the surface of the wafer;
    defining a pattern of the paths including the supporting elements on the film;
    selectively electroplating a first layer of metal on portions of the pattern to form the supporting elements;
    removing the film except for the portions of the defined pattern;
    coupling the pattern into an electrical metal deposition circuit;
    and
    electroplating a second layer of metal over the elements and over portions of the pattern not covered by the elements.

2. A method according to claim 1, wherein the first layer of metal is electroplated to a greater thickness than the second layer of metal.

3. A method according to claim 2, wherein in the steps of selectively electroplating a first layer of metal and electroplating a second layer of metal the electroplated metal is gold.

4. A method according to claim 3, wherein depositing a conductive film on the surface of the wafer comprises depositing a titanium film and then a platinum film.

5. A method according to claim 4, wherein defining a pattern of the paths comprises selectively masking the platinum film to protect the platinum in areas of the film for forming the desired pattern, and then etching portions of the platinum film not masked in aqua regia.

6. A method according to claim 3, wherein the pattern is electrically coupled through selected portions of the wafer into the metal deposition circuit.

7. A method according to claim 6, wherein the pattern is comprised of repetitive distinct pattern portions, each pattern portion overlying a region of the wafer which forms a distinct semiconductor device to be separated from the wafer, wherein the connecting elements are beam leads extending beyond each device in the wafer, and wherein electrically coupling the pattern through selected portions of the wafer comprises protecting a surface of the wafer opposite the surface with the pattern defined thereon from physical access of electrolyte during plating, contacting the insulated surface of the wafer with a cathode plating electrode, and establishing continuity with the beam leads through such portions of the wafer which do not form the distinct semiconductor devices.

8. A method according to claim 6, wherein selectively electroplating a first layer of gold on portions of the pattern comprises:
    uniformly masking the entire surface of the deposited film on the wafer with an electrically insulating material;
    selectively opening windows in the mask to expose areas of the pattern where the supporting elements are to be deposited;
    connecting the conductive film to a cathode of a plating circuit;
    and
    plating the supporting elements onto the exposed areas of the pattern.

9. In a method of making beam lead semiconductor devices, wherein a first layer of titanium and a second layer of platinum are deposited on a surface of a semiconductor wafer, wherein the second layer is selectively etched to eliminate the platinum except for a pattern onto which conductors and beam leads are electrolytically gold plated, and wherein portions of the first layer not covered by the pattern are removed prior to gold plating the pattern, the improvement comprising:
    prior to gold plating the entire pattern
    1. forming a masking layer over the entire surface of the wafer;
    2. opening portions of the masking layer to expose portions of the pattern to accommodate the beam leads of the devices;
    3. gold plating the beam leads to a desired thickness; and
    4. removing the remaining masking layer from the surface of the wafer.

* * * * *